United States Patent [19]

Kiehl

[11] Patent Number: 4,791,072
[45] Date of Patent: Dec. 13, 1988

[54] METHOD FOR MAKING A COMPLEMENTARY DEVICE CONTAINING MODFET

[75] Inventor: Richard A. Kiehl, New York, N.Y.

[73] Assignee: American Telephone and Telegraph Company, AT&T Bell Laboratories, Murray Hill, N.J.

[21] Appl. No.: 36,162

[22] Filed: Apr. 7, 1987

Related U.S. Application Data

[63] Continuation of Ser. No. 621,081, Jun. 15, 1984, abandoned.

[51] Int. Cl.$^4$ .............................................. H01L 27/10
[52] U.S. Cl. .................................... 437/56; 357/42; 357/58
[58] Field of Search ........................ 437/56, 58, 57

[56] References Cited

U.S. PATENT DOCUMENTS

| 4,163,237 | 7/1979 | Dingle et al. | 357/58 |
| 4,424,525 | 1/1984 | Mimura | 357/15 |
| 4,450,462 | 5/1984 | Nuyen | 357/16 |
| 4,471,367 | 9/1984 | Chen et al. | 357/22 |
| 4,538,165 | 8/1985 | Chang et al. | 357/22 |
| 4,688,061 | 8/1987 | Sakaki | 357/22 |

FOREIGN PATENT DOCUMENTS

| 2913068 | 10/1980 | Fed. Rep. of Germany | 357/22 MD |
| 58-48468 | 3/1983 | Japan | 357/42 |
| 56160196 | 4/1983 | Japan | 357/22 MD |
| 0361162 | 9/1983 | Japan . | |

Primary Examiner—Olik Chaudhuri
Attorney, Agent, or Firm—Richard D. Laumann; Peter A. Businger

[57] ABSTRACT

Complementary structure implemented in Group III-V compound semiconductors is obtained by using an n-channel field effect transistor and a p-channel MODFET.

17 Claims, 1 Drawing Sheet

METHOD FOR MAKING A COMPLEMENTARY DEVICE CONTAINING MODFET

This application is a continuation of application Ser. No. 621,081 filed June 15, 1984, now abandoned.

TECHNICAL FIELD

This invention relates generally to complementary logic structures and particularly to such structures implemented using modulation doped heterojunctions.

BACKGROUND OF THE INVENTION

Although many types of logic circuits have been contemplated and fabricated using semiconductors, one of special interest for today's technology relies on complementary symmetry and, as implemented in silicon, is referred to by those skilled in the art as a CMOS device. The essential features of the CMOS device are two field effect transistors with one transistor being a p-channel device and the other transistor being an n-channel device. For simplest circuit operation, the transistors should have similar operating characteristics. Hence, the term complementary is appropriate. The two transistors are typically manufactured adjacent each other on a common substrate. The CMOS device can be wired so that it functions as a logic gate as, for example, an inverter. Of course, logic gates other than inverters may also be fabricated.

CMOS has the advantageous feature of having relatively small power dissipation as compared to other logic circuit technologies. This is true because one of the FETs is typically off and the current drawn by that FET is nominally zero. Additional advantages over other logic circuits typically include shorter propagation delays as well as better rise and fall time characteristics.

While implementation of the CMOS structures in silicon is now generally well understood by those skilled in the art, implementation of a complementary symmetry structure in materials other than silicon, such as Group III-V compound semiconductors, would in many cases be desirable because the carrier mobilities in such semiconductors are often significantly higher than they are in silicon. The higher carrier mobilities hold promise of such desirable device characteristics as faster operation. One such Group III-V semiconductor is GaAs.

However, fabrication of complementary symmetry structures in GaAs has been difficult for several reasons. Although the electron mobility is significantly higher in Si than it is in GaAs, the hole mobilities in the two semiconductors are roughly comparable. As a result, the p-channel transistor is much slower and has much poorer current-voltage characteristics than does the n-channel transistor. Consequently, many of the potential advantages of the complementary structure are not realized. Additionally, the gate structure for the p-channel device is typically formed by a schottky barrier thus forming a MESFET (metal semiconductor field effect transistor). Unfortunately, the barrier is relatively low.

Yet another approach to improving device performance relies on a judicious choice of structures rather than material. One such approach is termed modulation doping. A modulation doped heterostructure separates carriers from ionized parent impurities by doping a wide bandgap semiconductor and leaving the adjacent narrow bandgap semiconductor with intrinsic conductivity. A two-dimensional carrier system then is created, which depending on the dopant, will comprise electrons or holes. Modulation doped heterostructures have not yet been successfully used in CMOS structures.

SUMMARY OF THE INVENTION

I have found that a complementary structure comprising a substrate and an n-channel field effect transistor and a p-channel MODFET (modulation doped field effect transistor) may be fabricated using Group III-V compound semiconductors. Additionally, Group IV or Group II-VI semiconductors may be used. Each transistor has source, gate, and drain electrodes and at least one electrode in the n-channel transistor is connected to at least one electrode of the p-channel transistor. In one embodiment, the p-channel transistor comprises an intrinsic conductivity GaAs layer adjacent to a p-type AlGaAs layer. The n-channel transistor is a MESFET which further comprises an n-type GaAs layer adjacent to the p-type AlGaAs layer. The electrodes contact the n- and p-type layers in the MESFET and MODFET, respectively. In one preferred embodiment, the p-type AlGaAs layer in the MESFET is fully depleted at equilibrium while the p-type AlGaAs layer in the p-channel MODFET is not. In yet another embodiment, the n-channel transistor is a MODFET. Group III-V compound semiconductors other than $Al_xGa_{1-x}As$ may also be used. The structures are expediently formed by growing all epitaxial layers, masking and relatively removing portions of one or more layers and depositing the electrodes. Because of the differences in the compositions of the layers, selective etching techniques can be used to precisely control layer removal.

DETAILED DESCRIPTION

Figure 1:
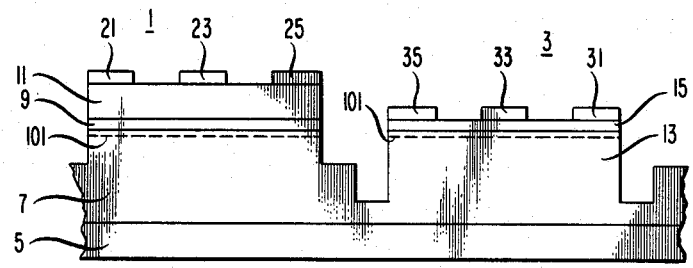
FIG. 1 is an end view of a complementary structure according to this invention.

One embodiment of a complementary structure according to my invention is represented in an end view in FIG. 1. Several other embodiments will also be discussed and still others will be readily apparent to those skilled in the art. For reasons of clarity, the elements of the structure are not drawn to scale. The structure comprises an n-channel MESFET, indicated generally as 1, and a p-channel MODFET, indicated generally as 3, both of which are disposed on a common substrate 5. The n-channel MESFET 1 further comprises intrinsic conductivity layer 7, p-type layer 9 and n-type layer 11. Layer 9 is positioned between layers 7 and 11. The term intrinsic conductivity is used to mean nominally undoped. The p-channel MODFET comprises intrinsic conductivity layer 13 and p-type layer 15. The intrinsic conductivity layers are nearest the substrate. Both the MESFET and the MODFET further comprise source, gate and drain electrodes indicated as 21, 23, and 25 to layer 11; and 31, 33, and 35 to layer 15, for the MESFET and the MODFET, respectively. At least one electrode of the MESFET is connected to at least one electrode of the MODFET. Typically the drain electrodes are connected to each other. A two-dimensional hole gas, indicated by the dashed line 101, forms in the i-layer at the heterojunction formed by the i- and p-type layers. It should be noted that a portion of the i-layer has been removed so that the hole gas formed is not common to the two transistors.

Exemplary layer thicknesses and doping concentration are: layers 7 and 13, 1 µm and undoped; layers 9 and 15, 450 Angstroms and $2 \times 10^{18}$ cm$^{-3}$; layer 11, 3000 Angstroms and $1 \times 10^{17}$ cm$^{-3}$.

The layers in this embodiment, and other embodiments, comprise Group III-V compound semiconductors. It will be appreciated that Group IV and Group II-VI semiconductors may also be used. In one exemplary embodiment, the intrinsic conductivity layers comprise GaAs, the p-type layers comprise AlGaAs, and the n-type layers comprise GaAs. The substrate comprises a Cr-doped GaAs substrate or an undoped LEC GaAs substrate and is semi-insulating. The layers and substrate are lattice matched, or approximately lattice matched, to each other. As is well known, the bandgap of the p-type layer should be greater than the bandgap of the i-type layer so that a two-dimensional hole gas forms in the i-type layer. Additionally, the doping concentrations and thickness of the p-type and n-type layers are desirably such that the p-type layer is entirely depleted at thermal equilibrium in the n-channel MESFET. Selection of such concentrations and thicknesses will be readily done by the skilled artisan. The source and drain electrodes are conventional and well-known contacts such as AuGe and AuBe may be used for contacting the n-type and p-type regions, respectively. The gate electrodes are formed by well-known metallizations such as Ti/Au. Although described as having an explicit i-type layer, it is to be understood that in some embodiments this layer may not be grown separately but will be part of the substrate.

It should be noted that the p-type layer in the MESFET serves as a barrier layer which provides confinement for the electrons moving in the n-type channel while it also serves as the p-type MODFET layer. If the doping concentrations for the n-type and p-type layers together with their thicknesses are properly selected as can be done by one skilled in the art, the p-n junction will deplete the p-layer and also the hole gas formed at the heterojunction between the p- and i-type layers in the MESFET. This situation arises because of the difference in potential barrier occurring on the n/p and vacuum/p-junctions. Depletion of the two-dimensional hole gas in the MESFET is desirable as these carriers are likely to result in increased device capacitance which will slow the device although not preclude its operation.

Embodiments having the p-type conductivity layers placed on top of the n-type conductivity layers are also contemplated. In this case, an i-type conductivity layer is sandwiched between the p-type and the n-type layers and the hole gas thereby formed at the p-i interface serves as the p-channel of the p-MODFET. It is also noted that the MESFET need not have a p-n junction, i.e., the MESFET may be a simple n-channel device.

Device fabrication is by techniques well known to those skilled in the art. The epitaxial layers are grown on the semi-insulating substrate by conventional and well-known crystal growth techniques such as molecular beam epitaxy. This appears to be the preferred growth technique at least at the present time, as it provides for precise control of the compositions, doping concentrations and layer thicknesses. After the epitaxial layers are grown, the n-type layer is removed by well known etching techniques. The use of a selective chemical etch such as hydrogen peroxide-ammonium hydroxide or a selective dry etching technique appears preferred since these techniques allow precise definition of the desired layers. The active device regions are then defined and isolated by conventional techniques such as chemical etching to form mesas or ion implantation to form insulating regions. The desired electrodes are now formed by conventional metallization techniques. Appropriate fabrication sequences for other embodiments will be readily apparent to those skilled in the art. The sequence described is advantageously employed because it does not require a regrowth step.

Figure 2:
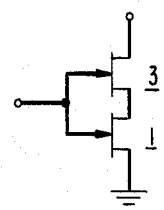
FIG. 2 is a circuit diagram of a CMES inverter according to this invention using the structure of FIG. 1.

Useful logic gates may be formed by suitably connecting electrodes on the two FETs. For example, if the drain contacts of the two FETs are connected electrically, a CMES (complementary metal semiconductor) inverter is obtained which is depicted schematically in FIG. 2. The drain contacts may be connected electrically by a drain metallization that is common to both FETs depicted in FIG. 1. The gate electrodes are also electrically connected to each other.

Figure 4:
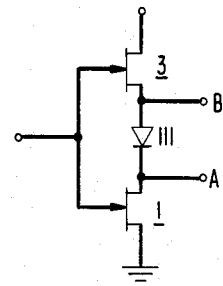
FIG. 4 is a circuit diagram of the structure of FIG. 3.
Figure 3:
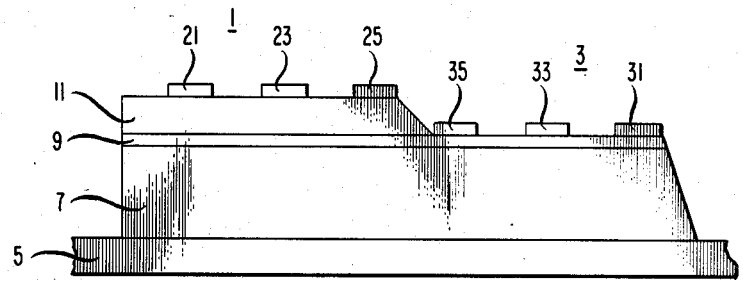
FIG. 3 is an end view of another embodiment of a complementary structure according to this invention.

Additional modifications of the embodiment depicted in FIG. 1 are also contemplated. One such modification is depicted in FIG. 3. Numerals identical to those in FIG. 1 represent identical elements. In this case, the p-type layer is common to both FETs, i.e., the etching does not remove a portion of the p-type layer 9 to physically isolate the two FETs, and electrodes contact the n- and p-type layers for the MESFET and MODFET, respectively. The resulting device is schematically represented in FIG. 4 and has the two drain electrodes separated by a diode. The diode may perform several useful functions. For example, it may function as a photodetector. Also, it could be used as a level shifting or voltage reference diode.

Other modifications will be readily thought of by those skilled in the art. For example, a p+ GaAs layer may be inserted between layers 9 and 11 of the MESFET in FIG. 1. This results in electron confinement in the channel being obtained with a homojunction rather than the heterojunction of FIG. 1.

Figure 5:
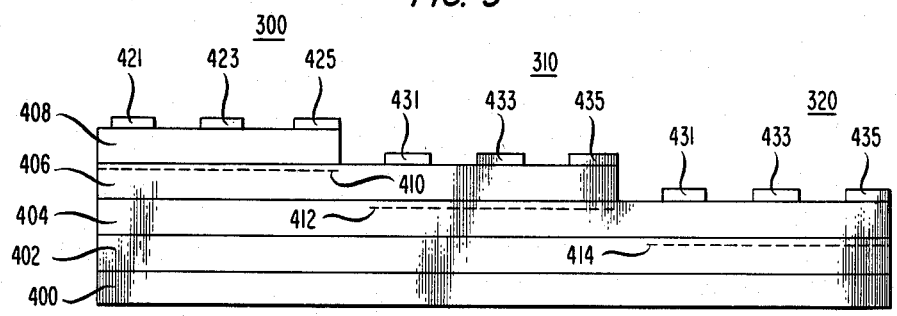
FIG. 5 is an end view of another embodiment of a complementary structure according to this invention.

Still other modifications are possible. One is depicted in FIG. 5 and uses MODFETs for the n-channel device as well as the p-channel device. Depicted are p-channel MODFET 300 and n-channel MODFETs 310 and 320. In practice, only one of the n-channel MODFETs will normally be present. However, explanation of various possible embodiments will be facilitated by describing this structure. The structure comprises substrate 400, first epitaxial layer 402 having intrinsic conductivity, second epitaxial layer 404 having n-type conductivity, third epitaxial layer 406 having intrinsic conductivity and fourth epitaxial layer 408 having p-type conductivity. The n- and p-type layers have bandgaps greater than the bandgaps of the adjacent intrinsic conductivity layer. Source, gate and drain electrodes 421, 423 and 425; 431, 433 and 435; and 431, 433 and 435; are made to the top layers of transistors 300, 310, and 320, respectively. A two-dimensional gas indicated by the dashed-line 410 forms at the interface between layers 406 and 408 of the p-channel MODFET 300. A two-dimensional electron gas indicated by the dashed-line 412 forms at the interface of layers 404 and 406 of the n- channel MODFET 310. A two-dimensional electron gas indicated by the dashed-line 414 forms at the interface between layers 402 and 404 of the n-channel MODFET 320. Again, at least one electrode of the p-channel transistor is connected to at least one electrode of the n-channel transistor. It is noted that transistor 310 has the n-type layer nearest the substrate while transistor 320 has the intrinsic layer nearest the substrate. Not all layers need be present in all embodiments. For example, if transistors 300 and 310 are to be formed, layer 402 may be omitted. For reasons of clarity, the full extent of the two-dimensional gases 412 and 414 is not shown.

Still other embodiments using both n-channel and p-channel MODFETs will be readily thought of by those skilled in the art. For example, it will be readily appreciated that a suitable choice of bandgaps for the layers in FIG. 5 will permit an n-channel MESFET to be formed.

What is claimed is:

1. A method for making a device comprising a complementary structure, said structure comprising an n-channel field effect transistor and a p-channel MODFET on a common substrate, said method comprising
  (i) a sequence of steps comprising semiconductor layer formation on said substrate, resulting in superposed n-channel field effect transistor and p-channel MODFET layer structures,
  (ii) a step comprising removal of selected portions of the last-deposited semiconductor layer so as to result in adjacent at least one first surface region and at least one second surface region, said first surface region being an n-channel field effect transistor region and said second surface region being a p-channel MODFET transistor region, and
  (iii) a step comprising the deposition of respective first and second source, gate, and drain contacts on said first surface region and on said second surface region, and interconnection of at least one of said first contacts to at least one of said second contacts, said method being characterized in that said sequence of steps comprises all the steps of semiconductor layer formation in making said device.

2. The method of claim 1 in which said n-channel field effect transistor is made as a MESFET.

3. The method of claim 2 in which making said MESFET comprises depositing, in sequence, a first layer having intrinsic conductivity, a second layer having p-type conductivity, and a third layer having n-type conductivity.

4. The method of claim 2 in which making said MESFET comprises depositing, in sequence, a first layer having p-type conductivity, a second layer having intrinsic conductivity, and a third layer having n-type conductivity.

5. The method of claim 1 in which making said p-channel MODFET comprises depositing a first layer having intrinsic conductivity and a first bandgap, and a second layer adjacent to said first layer and having p-type conductivity and a second bandgap, said first bandgap being less than said second bandgap.

6. The method of claim 5 in which making said device further comprises a step of forming a recess in said first layer, whereby said n-channel transistor and said p-channel MODFET are spaced from each other.

7. The method of claim 1 comprising a step of connecting said drain electrodes to each other.

8. The method of claim 1 in which said n-channel transistor is made as a MODFET.

9. The method of claim 8 in which making said n-channel MODFET comprises depositing a first layer having intrinsic conductivity and a first bandgap, and a second layer on said first layer and having n-type conductivity and a second bandgap, said first bandgap being less than said second bandgap.

10. The method of claim 9 in which said first layer is deposited prior to deposition of said third layer.

11. The method of claim 9 in which said second layer is deposited prior to deposition of said first layer.

12. The method of claim 9, further comprising depositing a third layer having intrinsic conductivity and a fourth layer having p-type conductivity.

13. The method of claim 12 said third layer being deposited adjacent to said second layer.

14. The method of claim 12 in which said fourth layer is deposited adjacent to said first layer.

15. The method of claim 5 in which making said MODFET further comprises depositing an n-type layer, said n-type layer being deposited directly on said substrate.

16. The method of claim 1 in which the material of said substrate and said layers is selected from the group consisting of Group IV, Group II–VI, and Group III–V semiconductors.

17. The method of claim 16 in which said Group III–V compound is selected to comprise $Al_xGa_{1-x}As$, x being greater than or equal to 0 and less than or equal to 1.

* * * * *